United States Patent
Ma et al.

(10) Patent No.: US 10,734,537 B2
(45) Date of Patent: Aug. 4, 2020

(54) HIGH PERFORMANCE, HIGH ELECTRON MOBILITY TRANSISTORS WITH GRAPHENE HOLE EXTRACTION CONTACTS

(71) Applicant: Wisconsin Alumni Research Foundation, Madison, WI (US)

(72) Inventors: Zhenqiang Ma, Middleton, WI (US); Tzu-Hsuan Chang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/806,724

(22) Filed: Nov. 8, 2017

(65) Prior Publication Data

US 2019/0140120 A1    May 9, 2019

(51) Int. Cl.

| | |
|---|---|
| H01L 31/0352 | (2006.01) |
| H01L 31/0304 | (2006.01) |
| H01L 31/11 | (2006.01) |
| G01J 1/42 | (2006.01) |
| H01L 31/0224 | (2006.01) |
| H01L 31/108 | (2006.01) |
| G01J 1/44 | (2006.01) |

(52) U.S. Cl.
CPC ...... *H01L 31/035272* (2013.01); *G01J 1/429* (2013.01); *H01L 31/022408* (2013.01); *H01L 31/03044* (2013.01); *H01L 31/03048* (2013.01); *H01L 31/108* (2013.01); *H01L 31/1085* (2013.01); *H01L 31/11* (2013.01); *G01J 2001/4473* (2013.01)

(58) Field of Classification Search
CPC ....... H01L 31/035272; H01L 31/03044; H01L 31/03048; H01L 31/11; G01J 1/429; G01J 2001/4473

USPC ....... 250/370.12, 200, 201.1, 370.01; 257/21
See application file for complete search history.

(56) References Cited

U.S. PATENT DOCUMENTS

| | | | | |
|---|---|---|---|---|
| 5,027,177 A | * | 6/1991 | Vasudev | ............. H01L 27/1443 257/131 |
| 5,533,509 A | * | 7/1996 | Koashi | ............... A61B 5/14532 356/41 |
| 8,872,159 B2 | | 10/2014 | Kub et al. | |
| 8,987,780 B2 | | 3/2015 | Zhang et al. | |
| 9,029,833 B2 | | 5/2015 | Kub et al. | |
| 9,887,637 B1 | * | 2/2018 | Shah | ..................... H02M 5/293 |

(Continued)

FOREIGN PATENT DOCUMENTS

WO    WO2017/080126    5/2017

OTHER PUBLICATIONS

Averine, S.V., et al., Solar-blind MSM-photodetectors based on AlxGa1-xN/GaN heterostructures grown by MOCVD, Solid-State Electronics 52, Feb. 21, 2008, pp. 618-624.

(Continued)

*Primary Examiner* — Blake C Riddick
(74) *Attorney, Agent, or Firm* — Bell & Manning, LLC; Michelle Manning (57) ABSTRACT

Radiation detectors based on high electron mobility transistors (HEMTs) are provided. Methods for detecting ultraviolet radiation using the HEMTs are also provided. The transistors are constructed from an intrinsic high bandgap semiconductor material with a built-in polarization field sandwiched between graphene and a two-dimensional electron gas (2DEG).

13 Claims, 7 Drawing Sheets

(56) References Cited

U.S. PATENT DOCUMENTS

| | | | | |
|---|---|---|---|---|
| 2003/0020092 | A1* | 1/2003 | Parikh | H01L 29/518 257/192 |
| 2007/0210329 | A1* | 9/2007 | Goto | H01L 29/42316 257/147 |
| 2010/0140660 | A1* | 6/2010 | Wu | H01L 29/2003 257/183 |
| 2011/0073911 | A1* | 3/2011 | Sato | H01L 29/107 257/194 |
| 2011/0169549 | A1* | 7/2011 | Wu | H02M 7/003 327/434 |
| 2012/0193677 | A1* | 8/2012 | Parikh | H01L 29/1075 257/190 |
| 2012/0223320 | A1* | 9/2012 | Dora | H01L 29/1608 257/76 |
| 2013/0001516 | A1* | 1/2013 | Hebard | H01L 29/1606 257/29 |
| 2013/0062621 | A1* | 3/2013 | Fichtenbaum | H01L 29/66462 257/77 |
| 2013/0082241 | A1* | 4/2013 | Kub | H01L 27/148 257/21 |
| 2014/0353722 | A1 | 12/2014 | Zhang et al. | |
| 2015/0060947 | A1* | 3/2015 | Koehler | H01L 29/267 257/194 |
| 2016/0109215 | A1* | 4/2016 | Dyer | G01B 9/02001 250/353 |
| 2016/0197203 | A1* | 7/2016 | Hu | H01L 29/66143 257/76 |
| 2019/0035901 | A1* | 1/2019 | Cheng | H01L 29/66462 |

OTHER PUBLICATIONS

Chiou, Yu-Zung, et al., High Detectivity InGaN-GaN Multiquantum Well p-n Junction Photodiodes, IEEE Journal of Quantum Electronics 39:5, May 2003, pp. 681-685.

Fisichella, Gabriele, et al., Current mapping in Graphene Contacts to AlGaN/GaN Heterostructures, Nanoscience and Nanometrology 1:1, Jul. 27, 2015, pp. 1-7.

Gaubas, Eugenijus, et al., Study of Charge Carrier Transport in GaN Sensors, Materials 9:293, Apr. 18, 2016, pp. 1-14.

Hu, Xinwen, et al., Proton-Irradiation Effects on AlGaN/AlN/GaN High Electron Mobility Transistors, IEEE Transactions on Nuclear Science 50:6, Dec. 2003, pp. 1791-1796.

Jiang, Hao, et al., Visible-Blind Metal-Semiconductor-Metal Photodetectors Based on Undoped AlGaN/GaN High Electron Mobility Transistor Structure, Japanese Journal of Applied Physics 43:5B, Apr. 28, 2004, pp. L683-L685.

Kumar, Manoj, et al., Demonstration of a large-area AlGaN/GaN Schottky barrier photodetector on Si with high detection limit, Semiconductor Science and Technology 28, Aug. 21, 2013, pp. 094005 (5 pp.).

Mannhart, J., et al., Two-Dimensional Electron Gases at Oxide Interfaces, MRS Bulletin 33, Nov. 2008, pp. 1027-1034.

Ohtomo, A, et al., A high-mobility electron gas at the LaAlO3/SrTiO3 heterointerface, Nature 427, Jan. 29, 2014, pp. 423-426.

Shen, Lingyan, et al., Passivation effect of graphene on ALGaN/GaN Schottky diode, RSC Advances 5, Oct. 2, 2015, pp. 86593-86597.

Stemmer, Susanne, et al., Two-Dimensional Electron Gases at Complex Oxide Interfaces, Annual Review of Materials Research 44, Jan. 29, 2014, pp. 151-171.

Tampo, H., et al., Polarization-induced two-dimensional electron gases in ZnMgO/ZnO heterostructures, Applied Physics Letters 93, Nov. 18, 2008, pp. 202104.

Xiao-Guang, He, et al., Formation of two-dimensional electron gas at AlGaN/GaN heterostructure and the derivation of its sheet density expression, Chin. Phys. B 24:6, Apr. 10, 2015, pp. 067301-1 to 067301-5.

Zou, K., et al., LaTiO3/KTaO3 interfaces: A new two-dimensional electron gas system, Apl Materials 3, Mar. 5, 2015, pp. 036104.

* cited by examiner

HIGH PERFORMANCE, HIGH ELECTRON MOBILITY TRANSISTORS WITH GRAPHENE HOLE EXTRACTION CONTACTS

REFERENCE TO GOVERNMENT RIGHTS

This invention was made with government support under N00014-13-1-0226 awarded by the NAVY/ONR and HR0011-15-2-0002 awarded by the DOD/DARPA. The government has certain rights in the invention.

BACKGROUND

Photodetection in the ultraviolet (UV) region has gained significant focus in recent years due to its wide range of applications, such as security, chemical detection, and military and lethal substance detection. Compared with Si-based UV photodetectors, which are based on low bandgap materials and work inefficiently over the UV spectrum, photodetectors based on III-V nitrides, such as AlGaN and GaN, possess several advantages, including solar-blind spectral selectivity, high breakdown field, high thermal stability, radiation hardness, and high responsivity. Structures including p-i-n diodes and metal-semiconductor-metal have been explored to improve performances, including high signal-to-noise ratio, fast transient response, high responsivity, high spectrum selectivity, and low dark current. However, UV detectors that meet all the requirements with one design have not yet been developed, because the traditional architectures of the photodetectors are not designed to work optimally over the short wavelength spectrum. The shallow penetration depth and the strong surface recombination within the highly doped contact layer are limiting factors in the operation of UV detectors.

AlGaN/GaN HEMTs have been used as UV detectors. The high mobility of the 2DEG and the low doping profile of the whole structures yield a high-speed response for these UV detectors. Although electron transportation in the 2DEG layer is robust and fast, the carriers on the surface of AlGaN suffer from surface recombination and short lifetimes.

SUMMARY

Radiation detectors based on high electron mobility transistors are provided. Methods for detecting ultraviolet radiation using the high electron mobility transistors are also provided.

One embodiment of a high electron mobility transistor includes: a heterostructure comprising a first layer comprising an intrinsic semiconductor and a second layer comprising a second semiconductor; a polarization charge-induced two-dimensional electron gas formed at an interface between the first layer and the second layer of the heterostructure; a layer comprising electrically conducting graphene disposed over the first layer of the heterostructure, such that the first layer of the heterostructure is disposed between the layer comprising the graphene and the two-dimensional electron gas; an anode in contact with the graphene; and a cathode in contact with the two-dimensional electron gas.

One embodiment of a method for detecting ultraviolet radiation using a high electron mobility transistor, as described herein includes: exposing the layer comprising electrically conducting graphene to incident ultraviolet radiation, wherein at least a portion of the incident ultraviolet radiation passed through the electrically conducting graphene and into the intrinsic semiconductor, generating electron-hole pairs; extracting holes of the electron-hole pairs with the electrically conducting graphene; and extracting electrons of the electron-hole pairs with the two-dimensional electron gas.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 1A-1C depict designs of super-fast vertical UV photodetectors with unique 2DEG and graphene as extraction contact materials.

FIGS. 2A-2D depict the static photoresponse of the graphene enhanced AlGaN/GaN photodetectors.

FIGS. 3A-3C depict transient response of graphene enhanced AlGaN/GaN UV detectors.

DETAILED DESCRIPTION

Radiation detectors based on high electron mobility transistors (HEMTs) are provided. Methods for detecting ultraviolet radiation using the HEMTs are also provided. The transistors are constructed from an intrinsic high bandgap semiconductor material with a built-in polarization field sandwiched between two exceptionally conductive layers: graphene and two-dimensional electron gas (2DEG).

The HEMTs have a vertical arrangement in which a layer electrically-conductive, UV-transparent layer of graphene is disposed directly over a layer of the intrinsic high bandgap material. The graphene is in contact with a Schottky anode contact and extends the effective area of the Schottky contact over the intrinsic high bandgap semiconductor material. Similarly, the 2DEG is in contact with a cathode and extends the effective area of that contact under the intrinsic high bandgap semiconductor material. In this device design, the 2DEG provides an electron extraction contact material and the graphene provides a hole extraction contact material, as well as an ultraviolet window.

The intrinsic high bandgap semiconductor is a crystalline material having a built-in polarization. As used herein, the term intrinsic indicates that the only dopants present in the material are intrinsic dopants and that the material has not been extrinsically doped. For UV detection applications, the high bandgap semiconductor allows the material to absorb in the ultraviolet region of the electromagnetic spectrum. Thus, for photodetectors that operate in the UVA-UVC regions of electromagnetic spectrum, the band gap of the high bandgap semiconductor should be in the range from about 3.1 eV to about 6.2 eV. Intrinsic materials can also be referred to as undoped materials. In some embodiments of the HEMTs, the intrinsic high bandgap semiconductor material is a Group III-nitride, such as GaN or AlGaN. The use of Group III-V nitride semiconductors is advantageous for ultraviolet photodetectors because those semiconductors have good spectral selectivity for ultraviolet light and therefore, can be used in visible-blind photodetectors. The absorption spectrum of the intrinsic semiconductors will depend on the selected semiconductor material. For example, for intrinsic $Al_xGa_{1-x}N$, the absorption spectrum can be adjusted by adjusting the value of x in the range from $0 \leq x \leq 1$.

The intrinsic high bandgap semiconductor layer can be quite thin, having a thickness of, for example, no greater than 100 nm. This includes layers with thicknesses of no greater than 50 nm and further includes layers with thicknesses of no greater than 30 nm.

In the HEMTs, the intrinsic high bandgap semiconductor forms a heterostructure with a second semiconductor material and the built-in polarization of the intrinsic high bandgap semiconductor gives rise to a 2DEG at an interface between the two semiconductor layers. If the two semiconductor layers are directly adjacent, the 2DEG will form at the interface between the intrinsic high bandgap semiconductor and the second semiconductor. However, the heterostructure may further include a semiconductor interlayer between the intrinsic high bandgap semiconductor material and the second semiconductor material. If a semiconductor interlayer is present, the 2DEG will form at the interface between the interlayer and the second semiconductor. The interlayer, which can be included in order to improve the sheet carrier mobility of the 2DEG, may be an intrinsic semiconductor having a higher bandgap and a higher polarization than the intrinsic high bandgap semiconductor layer. The intrinsic layer can is typically very thin, having a thickness of, for example, 10 nm or less. This includes intrinsic layers having thicknesses of 5 nm or less. If the intrinsic high bandgap semiconductor material is a Group III-nitride, the second semiconductor layer and intrinsic layer will typically also be Group III-nitride semiconductors. As illustrate in the Example, one embodiment of a HEMT comprises an AlN interlayer sandwiched between an intrinsic AlGaN layer and a GaN layer. Some embodiments of the heterostructure may further include a semiconductor cap layer, such as a silicon doped AlGaN layer. If the cap layer in present, the graphene layer is disposed on the cap layer.

The graphene hole extraction contact layer can be composed of a single sheet of graphene or multiple sheets of graphene. The graphene is desirably electrically conducting and, therefore, undoped. However, the graphene should be sufficiently thin that it is transparent to incident radiation at operating wavelengths of the radiation detector. In order for the graphene to be considered transparent, it need not be 100% transparent, but should be sufficiently transparent to allow the detector to be operable. Generally, a higher transparency is preferred. Thus, in some embodiments, the graphene has a transparency of at least 99% at one or more operating wavelengths. A lower degree of transparency (e.g., $\leq 50\%$; $\leq 70\%$, or $\leq 90\%$) may be suitable for some applications. The graphene desirably covers all, or substantially all (e.g., $\geq 80\%$; or $\geq 90\%$), of the exposed upper surface of the intrinsic high bandgap semiconductor layer through with the incident light enters the device.

The Schottky anode and the cathode are fabricated from highly electrically conductive materials, such as metals, and can make direct contact with the graphene and 2DEG, respectively, such that the charge carriers that have been extracted into the graphene and 2DEG can travel with high mobility to their respective electrodes.

Figure 1A:
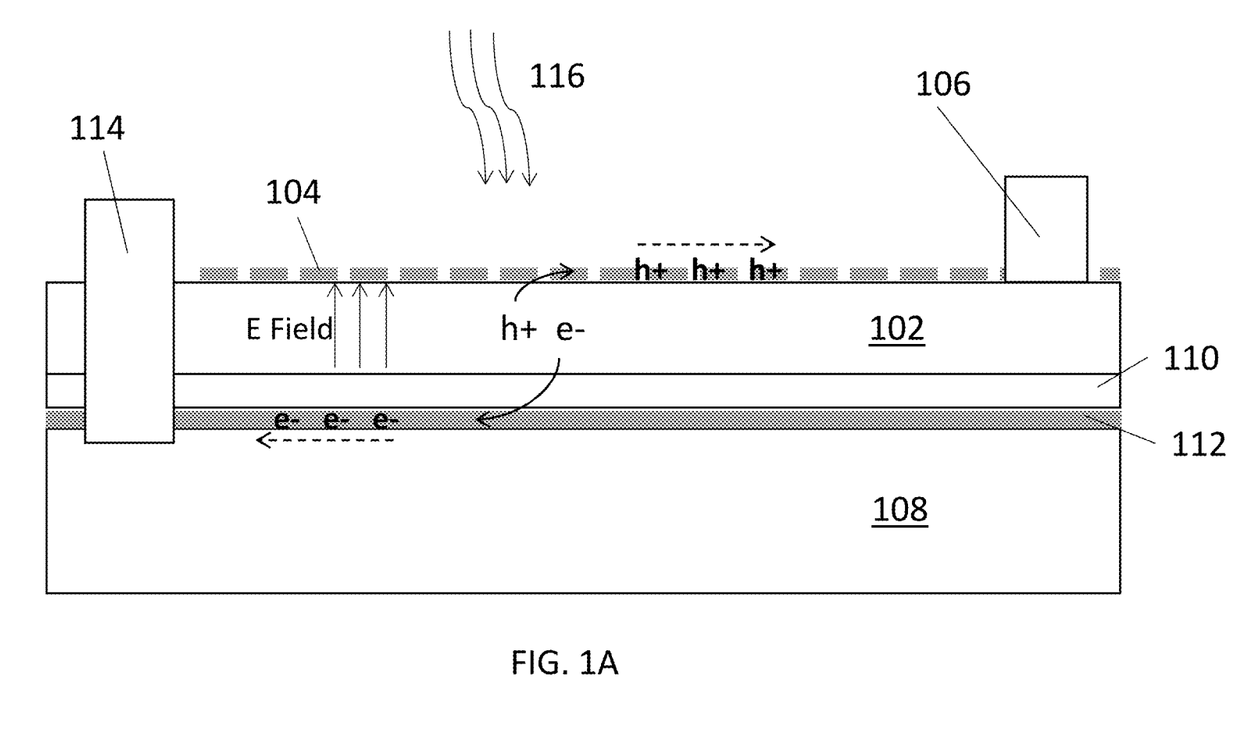
FIG. 1A shows a schematic of the carrier transportation in the graphene and 2DEG sandwiched AlGaN/GaN HEMTs structures.

One embodiment of a HEMT is shown schematically in FIG. 1A. The HEMT includes a layer of intrinsic high bandgap semiconductor 102 with an overlying layer of graphene 104. Graphene 104 extends over the upper surface of intrinsic high bandgap semiconductor layer 104 and is in contact with anode contact 106. The HEMT further includes a second semiconductor layer 108 that is spaced apart from intrinsic high bandgap semiconductor layer 102 by semiconductor interlayer 110. Under the influence of the built-in polarization of intrinsic high bandgap semiconductor 102, a 2DEG 112 is formed at the interface between interlayer 110 and second semiconductor layer 108. Cathode contact 114 is in contact with 2DEG 112. When intrinsic high bandgap semiconductor 102 is irradiated with incident radiation 116, such as UV radiation, electron-hole pairs (h+/e−) are formed in intrinsic high bandgap semiconductor layer 102. Under the influence of a drift voltage from the intrinsic polarization field of the intrinsic high bandgap semiconductor 102, the electrons and holes travel vertically to 2DEG 112 and graphene 104, respectively, where they travel laterally to cathode contact 114 and anode contact 106, respectively.

Various embodiments of the HEMTs are characterized by low dark-state currents, high signal-to-noise ratios, and ultra-fast response times. For example, as illustrated in the Example, HEMTs based on the present device design can have a signal-to-noise ratios of $10^5$ and higher and/or response times of less than 2 nm. Embodiments of the HEMTs that operate as visible-blind, UV detectors can have a UV-to-Vis ratio of at least $10^4$.

Unless otherwise indicated any reference to measured or measurable values described herein refers to those values as measured at room temperature (~23° C.) and atmospheric pressure.

Although the Group III-V semiconductor materials are used to illustrate semiconductor materials that can be used in the fabrication of the HEMTs in the foregoing description and the Example that follows, other semiconductor materials can be used. By way of illustration only, polarization-induced 2DEGs can be formed at other semiconductor heterostructure interfaces such as, $LaAlO_3/SrTiO_3$, $LaTiO_3/KTaO_3$, and $ZnMgO/ZnO$ interfaces.

EXAMPLE

In this example, graphene is introduced to extend the effective area of the Schottky metal anode contact to extract holes directly once they have been generated. The electric field applied from the metal pad can be extended from the metal pad to the entire UV exposed area covered by graphene above and 2DEG beneath. After the excitons are separated by the intrinsic polarization field vertically inside the AlGaN, the holes and electrons will travel in their shortest paths to graphene and 2DEG, respectively, and subsequently be collected by metal electrodes. The proposed structures show significant reduction in the dark current, increase in the signal to noise ratio, high selectivity for visible light, and fast transient response.

Results and Discussions

Figure 1B:
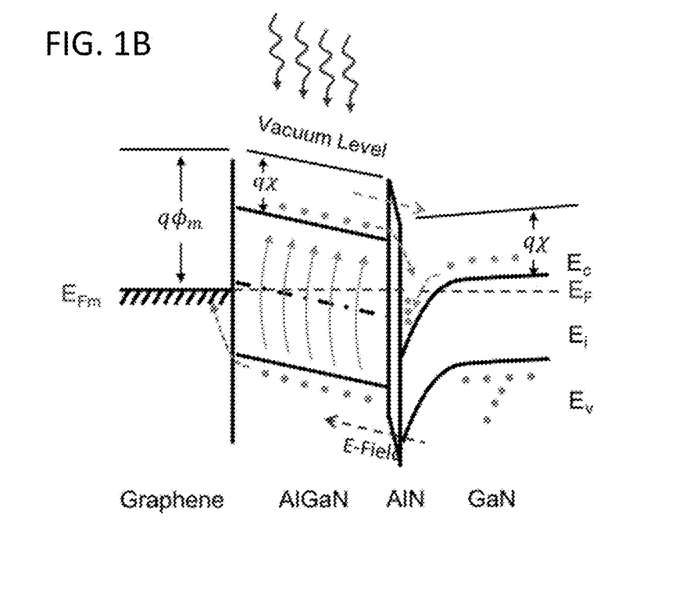
FIG. 1B shows a band diagram of the vertical AlGaN/GaN HEMTs UV detector with graphene as a transparent electrode.
Figure 1C:
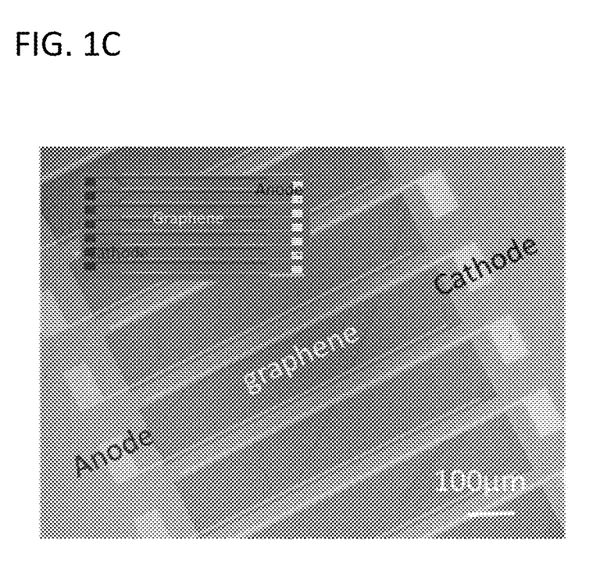
FIG. 1C shows an SEM of solar-blind AlGaN/GaN HEMTs UV detectors with graphene as transparent electrodes. The intercept is the optical image of the array of UV detectors. Scale bar=200 µm.

To design a UV detector that meets the requirements of low dark current, fast relaxation time, fast response, and high signal-to-noise ratio, the use of a highly doped layer and low bandgap materials should be avoided, while still maintaining the effective carrier extraction electrical field. FIG. 1A shows a schematic layout of an AlGaN/GaN UV detector with graphene as a transparent electrode. Graphene is placed directly on top of the photodetector area as a transparent extension to the anode electrodes. Upon irradiation with incident UV light, photons first pass through the graphene and are absorbed by the AlGaN layer that is sandwiched between the graphene and the 2DEG. Graphene can effectively extend the extraction area from the anode without blocking the incident UV light. The excitons generated in the AlGaN layer are quickly separated and drift under the influence of the built-in polarization field of the AlGaN structure, as shown in FIG. 1B. The built-in polarization electrical field can be as strong as 6 MV/cm. This strong polarization from the lattice orientation of HEMTS increases the electron carrier density in the 2DEG channel, which has an ultra-high mobility with low doping and low resistance. As a result, the dissociated photocarriers drift swiftly vertically under the polarization field and are collected by the two extraction contact materials. Because the field in the HEMT is generated by a polarization field, rather than a built-in electronic field, the device does not require the use of a highly doped contact layer. Thus, the photodetector can be fabricated from non-extrinsically doped materials, as shown in FIG. 1C.

Furthermore, in contrast to conventional photodetectors involving lateral transport of carriers to the nearest metal electrodes separated by several micrometers, the chance of surface recombination is minimized by introducing the graphene/2DEG carrier transport structures, as the holes drift toward and are collected by the graphene, while electrons drift toward and are collected by the 2DEG.

Figure 2A:
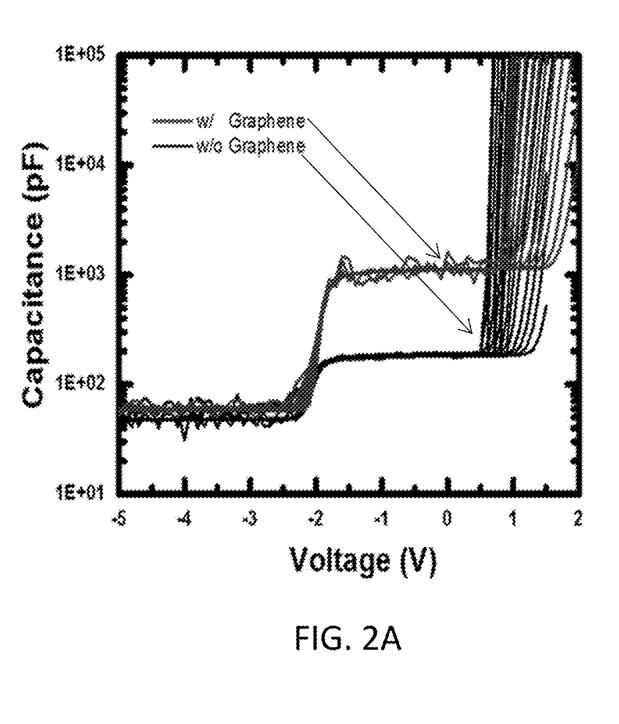
FIG. 2A shows an optical image of finished detectors after graphene is picked up (bottom) and PMMA is removed (top). The rectangle square marks the location of the transparent graphene electrode coverage.
Figure 2B:
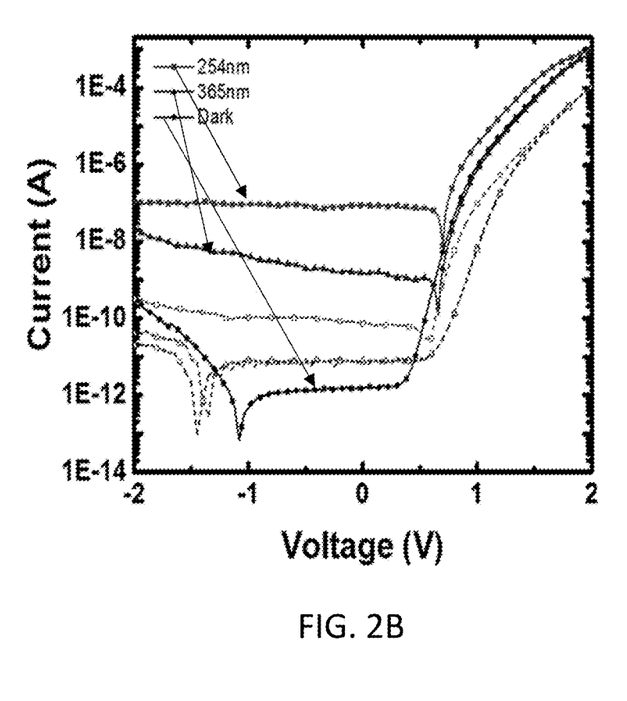
FIG. 2B shows a photocurrent measurement of the devices under exposure of 254 nm and 354 nm UV light. The solid line represents the device with graphene. Dash line represents the device without graphene. Scale bar=200 µm.
Figure 2C:
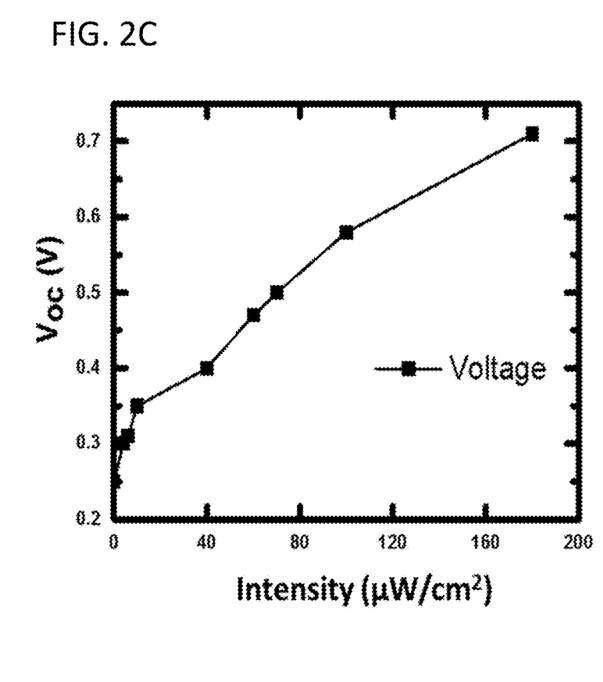
FIG. 2C depicts the open voltage of the detectors with respect to the incident intensity of the UV light.
Figure 2D:
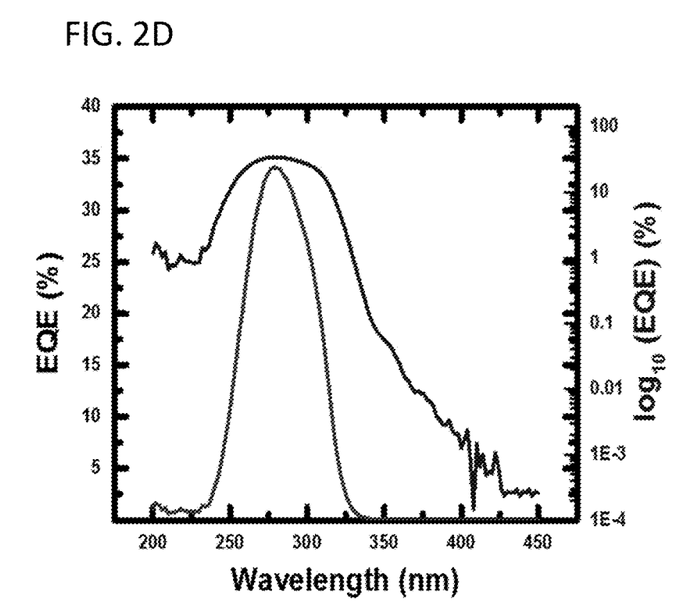
FIG. 2D shows an EQE of the UV detectors over the UV and visible spectra.

To confirm the conductivity effectiveness of the graphene, capacitance measurements across the anode and cathode of the photodetectors were carried out. As shown in FIG. 2A, capacitance across two electrodes increased by 5 times when graphene was present. This proves the effective carrier conduction area covered by the electrode was extended by the graphene. Therefore, the generated carriers (holes) could be, without the need of lateral transport, vertically collected by the graphene. The static photoresponses are shown in FIG. 2B. Upon irradiation with the incident 254 nm light, the device with graphene showed increased photocurrent by 5 orders of maginitude at zero extraction bias and lower dark currents of 0.1 pA, to the limit of measurement tool HP4155B. That the photocurrent remained the same with different extraction biases shows that the extraction had reached saturation due to the strong built-in polarization from the structures. The small voltage needed for self-extraction was the key to showing the fast on-and-off switching of the UV detectors. The polarization field reflected the open voltage of the detectors as the photovoltaic effect, shown in FIG. 2C. The open voltage could be measured up to 0.7 V. Upon irradiation with incident 365 nm light, most of the light was absorbed by the bottom GaN layer; however, the photocurrent was 50-200 times smaller than the 254 nm light incidence. This can be explained from FIG. 1B, which shows that the holes generated in the GaN layer, in order to be collected in the graphene, needed to overcome a large barrier in the valence band between GaN and AlGaN, which eventually lead to reduced photocurrent. Thus, this unique structure enabled narrow-band absorption selectivity for visible light, as illustrated in FIG. 2D, and could be adjustable in terms of absorption wavelength by altering the Al composition of the AlGaN layer. Additionally, the photogenerated carriers were found to have been extracted efficiently over the low applied voltage range from −1 to 0.7V. The low extraction voltage indicated that the responding speed of the designed UV detectors was much faster compared to the traditional UV detectors.

Figure 3A:
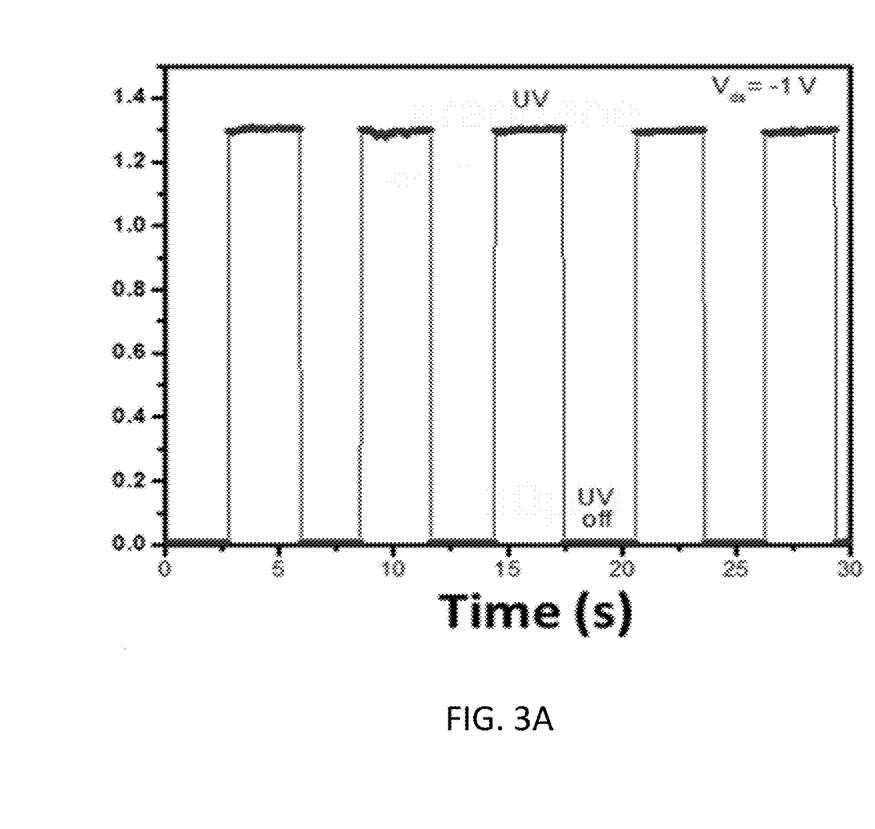
FIG. 3A shows a low-scale transient response read from HP4155.
Figure 3B:
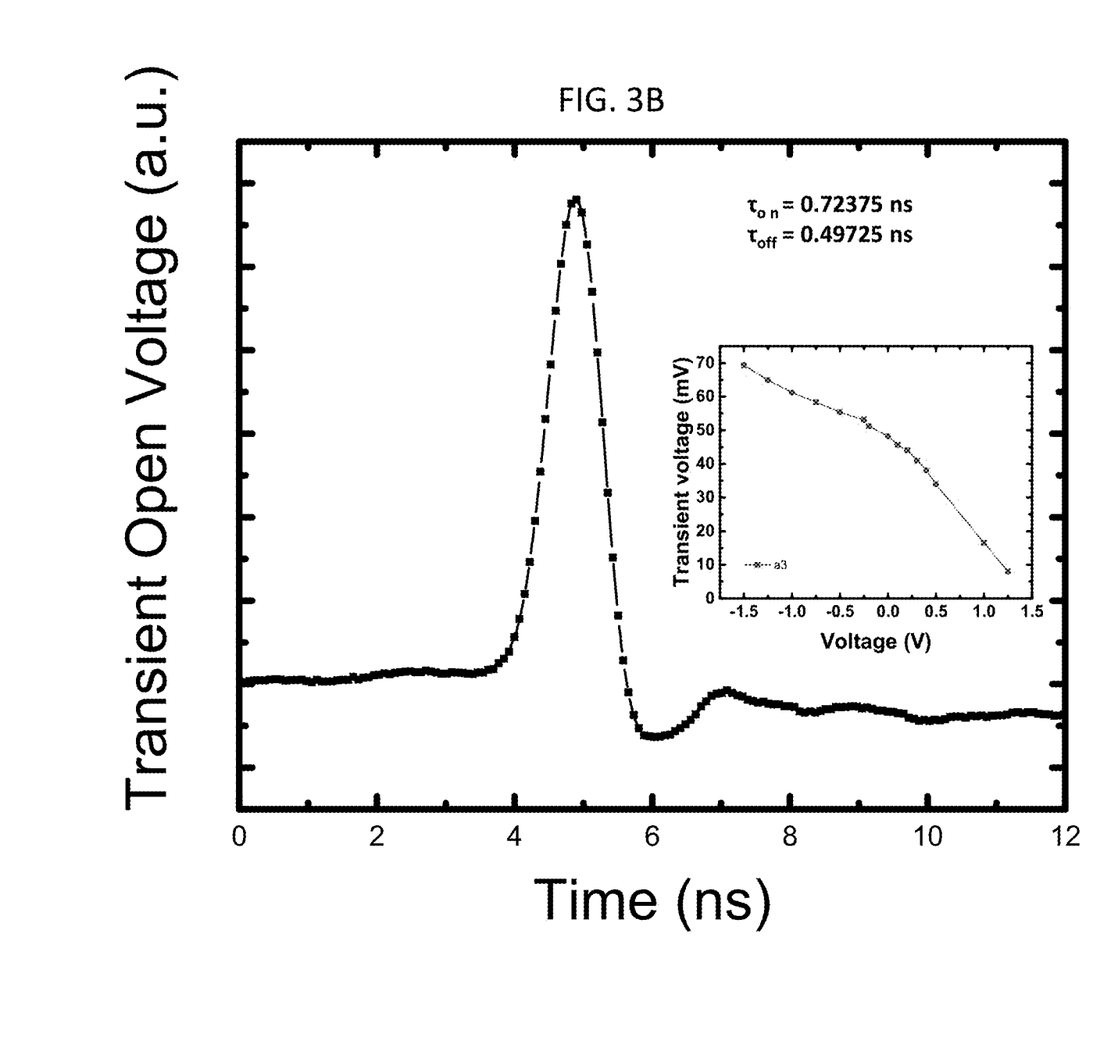
FIG. 3B shows a 100 kHz transient voltage response with pulse <10 fs.
Figure 3C:
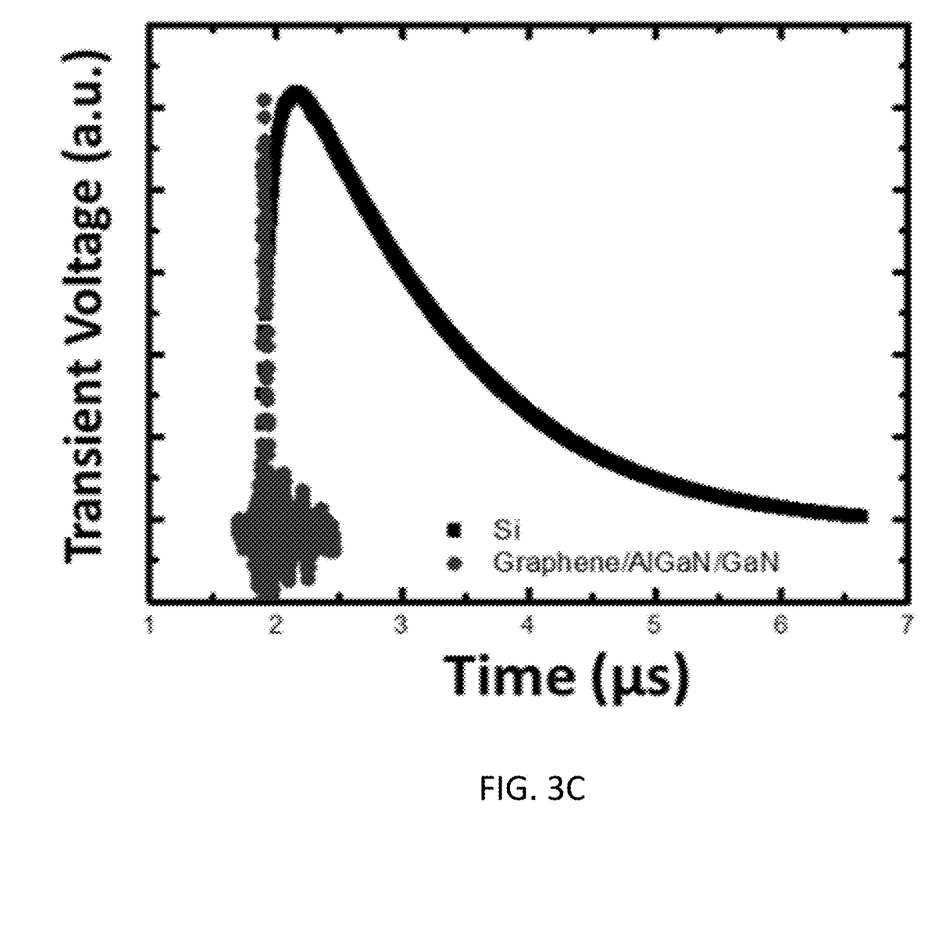
FIG. 3C compares the photodetector (this work) with a commercial Thorlab Si photodetector without applying extraction bias.

FIGS. 3A-3C demonstrate the comb structures UV detectors where the fin is composed of alloyed contact to 2DEG and transparent graphene/metal fin structures. The fin type metal was placed on graphene to further reduce the resistivity of the detectors. In order to measure the transient open circuit voltage response of the devices, sub-50 fs UV pulses with a center wavelength of 290 nm were generated by frequency doubling the 580 nm output of a nonlinear optical parametric amplifier system (NOPA) operating at a repetition rate of 100 kHz. These ultrafast UV pulses were focused onto the devices with fluences ranging from 100-1000 nJ/cm$^2$. The transient open circuit voltage response of the device was recorded and averaged using a high-speed gated waveform analyzer (Zurich Instruments, UHFLI). In the measurement, the AlGaN/GaN photodetectors showed a symmetric and sharp rise/relaxation time, with $\tau_{on}$=0.72 ns, $\tau_{off}$=0.49 ns $\tau_{FHWM}$=0.87 ns. As plotted in the inset of FIG. 3B, an additional extraction field and an increase in the open voltage indicated the acceleration of the carrier correction. To demonstrate the improvement in the intrinsic carrier-transport of the present devices, which eliminate the need of accelerating photocarriers through the external bias, relative to a commercially available Si photocetector, the performances of the two types of devices were compared. Since the area of the two detectors was different, the open-voltage outputs of the two devices were normalized based on the peak voltage point of the devices, as shown in FIG. 3C. The Si photodetector had a 1 μs rise time and more than 10 μs relaxation time. The plots of the responses of the devices were measured at zero bias. The non-symmetrical response from the Si photodetectors was caused by deep energy carrier excitation and strong surface recombination under the short wavelength exposure.

Methods

Detector Fabrication

AlGaN/GaN high electron mobility transistors on Si substrates were used in this study. The AlGaN/GaN heterostructure consisted of a 25 nm thick AlGaN strain spacer layer, a 2 nm AlN spacer interlayer, and a 3 μm thick, low doped GaN layer. The Al mole fraction of the top AlGaN layer was 0.25. The sheet carrier density and the drift mobility were measured at $6*10^{12}$ cm$^{-2}$ and 2100 cm$^2$/Vs, respectively, through standard Hall Bar measurement. Metal structures Ti/Al/Ni/Au with thicknesses of 20 nm, 110 nm, 50 nm and 50 nm, respectively, were deposited as the first metal contact layer and, following the ohmic contact, formed in a rapid thermal annealing chamber at 800° C. for 90 seconds. The second metal contacts, Ni/Au, weres placed next to the ohmic contact pad with thicknesses equal to 20 nm and 100 nm, respectively. Two metal electrodes were separated from each other by 100 μm, with a width of 10 μm and length of 1.5 mm. Before transferring the graphene, the samples were immersed and cleaned with an ultrasonic in Shipley micro stripper 1165 for 30 minutes to clean any residue during the metal deposition process. This step was critical to generate a clean graphene contact surface to further reduce the noise current in the device.

Once the samples were cleaned, a monolayer of graphene grown on a copper foil, with mobility measured as 3040 cm$^2$/Vs, was transferred on top of the AlGaN/GaN heterostructure by standard PMMA and wet transferring methods. After removing the PMMA, the graphene was patterned into 1 mm×60 μm covering the Schottky contact metal pad. Graphene covering the ohmic contact pad was etched away using a short term oxygen plasma treatment.

Following the ohmic contact formation, the structure was annealed for 90 seconds. The second metal contact Ni/Au was placed next to the ohmic contact pad with thicknesses equal to 20 nm and 100 nm, respectively. Two metal electrodes were separated from each other by 100 μm, with a width of 10 μm and a length of 1.5 mm. Before transferring the graphene, the samples were immersed and cleaned with an ultrasonic in Shipley micro stripper 1165 for 30 minutes to clean any residue from the metal deposition process. This step generated a clean graphene contact surface to further reduce the noise current in the device.

Measurement Setup

The external quantum efficiency (EQE) of UV detectors was measured with a custom optical setup. Two light sources were combined to provide broad spectral wavelengths from ultraviolet to near-infrared. Specifically, a xenon lamp and a tungsten lamp were used to provide ultraviolet/visible, and visible/near-infrared light, respectively. The strong emission peaks above 800 nm from the xenon lamp were removed by putting a KG5 colored glass bandpass filter in front of the xenon lamp. The combined light passed through a 50/50 beam splitter and entered a monochromator. To prevent the influence of higher energy multiples of light, three long pass filters of 1090, 680 and 420 nm were used to measure the output monochromatic light above 1090 nm, between 680 to 1090 nm, and between 420 to 680 nm, respectively. There was no filter for light below 420 nm. A mechanical chopper was put on the light path and connected to a lock-in amplifier. Calibrated Newport 818-UV (300-1088 nm) and 818-IR (800-1300 nm) detectors were first put on the focused spot to measure the incident light intensity per unit area, $I_{incident}$, with a lock-in amplifier. UV detector devices then replaced the photo detectors to measure the generated photocurrent per unit area, $I_{photocurrent}$, with the same lock-in amplifier. The EQE was calculated by $I_{photocurrent}/I_{incident}$.

Transient Measurement

To measure the transient open circuit voltage response of the devices, sub-50 fs UV pulses with a center wavelength of 290 nm were generated by frequency doubling the 580 nm output of a nonlinear optical parametric amplifier system (NOPA) operating at a repetition rate of 100 kHz. The incident light from the NOPA was fed into beta barium borate (BBO) crystals purchased from Newlight Photonic Inc., with second harmonic generation (SHG) set at 580 nm. Output UV signals were further filtered through a bandpass filter purchased from Thorlabs Inc. These ultrafast UV pulses were focused onto the devices with fluences ranging from 100 to 1000 nJ/cm$^2$. The transient photo response was read with a Cascade RF probe, and an SMI to BMI cable with max 2 g was used as the connection. The transient open circuit voltage response of the device was recorded and averaged using a high speed gated waveform analyzer (Zurich Instruments, UHFLI).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A vertical photodetector comprising:
    a heterostructure comprising a first layer comprising a photoresponsive intrinsic semiconductor and a second layer comprising a second semiconductor;
    a photogenerated electron extraction contact comprising a polarization charge-induced two-dimensional electron gas formed at an interface between the first layer and the second layer of the heterostructure;
    a photogenerated hole extraction contact comprising a layer comprising electrically conducting graphene disposed over the first layer of the heterostructure in a vertical arrangement, such that the first layer of the heterostructure is disposed between the layer comprising the graphene and the two-dimensional electron gas;
    an anode in contact with the graphene; and
    a cathode in contact with the two-dimensional electron gas.

2. The photodetector of claim 1, wherein the first intrinsic semiconductor is a first intrinsic Group III-V semiconductor and the second semiconductor is a second Group III-V semiconductor.

3. The photodetector of claim 1, wherein the first intrinsic Group III-V semiconductor is AlGaN and the second Group III-V semiconductor is GaN.

4. The photodetector of claim 1, wherein the first layer has a thickness of no greater than 100 nm.

5. The photodetector of claim 1, wherein the first layer has a thickness of no greater than 50 nm.

6. The photodetector of claim 1, wherein the heterostructure further includes a semiconductor cap layer over the first layer and the layer comprising electrically conducting graphene is disposed on the cap layer.

7. A vertical photodetector comprising:
    a heterostructure comprising a first layer comprising a photoresponsive intrinsic semiconductor, a second layer comprising a second semiconductor, and a semiconductor interlayer between the first layer and the second layer;
    a photogenerated electron extraction contact comprising a polarization charge-induced two-dimensional electron gas formed at an interface between the first layer and the second layer of the heterostructure;
    a photogenerated hole extraction contact comprising a layer comprising electrically conducting graphene disposed over the first layer of the heterostructure in a vertical arrangement, such that the first layer of the heterostructure is disposed between the layer comprising the graphene and the two-dimensional electron gas;

an anode in contact with the graphene; and a cathode in contact with the two-dimensional electron gas.

8. The photodetector of claim 7, wherein the first intrinsic Group III-V semiconductor is AlGaN, the second Group III-V semiconductor is GaN, and the interlayer is an AN interlayer.

9. A method of detecting ultraviolet radiation using a vertical photodetector comprising:
- a heterostructure comprising a first layer comprising a photoresponsive intrinsic semiconductor and a second layer comprising a second semiconductor;
- a photogenerated electron extraction contact comprising a polarization charge-induced two-dimensional electron gas formed at an interface between the first layer and the second layer of the heterostructure;
- a photogenerated hole extraction contact comprising a layer comprising electrically conducting graphene disposed over the first layer of the heterostructure in a vertical arrangement, such that the first layer of the heterostructure is disposed between the layer comprising the graphene and the two-dimensional electron gas;
- an anode in contact with the graphene; and
- a cathode in contact with the two-dimensional electron gas, the method comprising:
- exposing the layer comprising electrically conducting graphene to incident ultraviolet radiation, wherein at least a portion of the incident ultraviolet radiation passes through the electrically conducting graphene and into the intrinsic semiconductor, generating electron-hole pairs;
- extracting holes of the electron-hole pairs with the electrically conducting graphene; and
- extracting electrons of the electron-hole pairs with the two-dimensional electron gas.

10. The method of claim 9, wherein the first intrinsic semiconductor is AlGaN and the second semiconductor is GaN.

11. The method of claim 10, wherein the photodetector has a signal-to-noise ratio of $10^5$ or greater.

12. The method of claim 10, wherein the photodetector has a response time of 2 ns or less.

13. The method of claim 10, wherein the photodetector has a dark current of 1 pA or lower.

* * * * *

UNITED STATES PATENT AND TRADEMARK OFFICE
CERTIFICATE OF CORRECTION

PATENT NO. : 10,734,537 B2
APPLICATION NO. : 15/806724
DATED : August 4, 2020
INVENTOR(S) : Zhenqiang Ma et al.

It is certified that error appears in the above-identified patent and that said Letters Patent is hereby corrected as shown below:

In the Specification

Column 3, Line 54:
Delete the phrase "comprises an AIN interlayer" and replace with --comprises an AlN interlayer--.

Column 6, Line 52:
Delete the phrase "2 nm AIN spacer interlayer," and replace with --2 nm AlN spacer interlayer,--.

In the Claims

Claim 8, Column 9, Lines 6-7:
Delete the phrase "and the interlayer is an AN interlayer." and replace with --and the interlayer is an AlN interlayer.--.

Signed and Sealed this
Third Day of November, 2020

Andrei Iancu
*Director of the United States Patent and Trademark Office*